Dec. 2, 1969 K. KASSCHAU 3,481,794

THERMOELECTRIC DEVICE WITH PLASTIC STRAIN INDUCING MEANS

Filed March 11, 1965

INVENTOR
Kenneth Kasschau
BY Zygmund L. Hermer
ATTORNEY 3,481,794
THERMOELECTRIC DEVICE WITH PLASTIC STRAIN INDUCING MEANS Kenneth Kasschau, Bridgeville, Pa., assignor to Westinghouse Electric Corporation, Pittsburgh, Pa., a corporation of Pennsylvania
Filed Mar. 11, 1965, Ser. No. 438,851
Int. Cl. H01v *1/32*
U.S. Cl. 136—208 7 Claims

ABSTRACT OF THE DISCLOSURE

A tubular thermoelectric device is provided wherein a pair of concentric tubular supporting members receive a plurality of tandemly arranged annular thermoelectric pellets therebetween. Electrical contact between pellets and thermal contact between pellets and supporting members is enhanced by providing plastic strain inducing means in association with at least one of the supporting members.

In one example the strain inducing means is a pressurized chamber filled with a liquid metal and positioned such that the pressurized liquid metal forces the supporting members into more intimate thermal contact with the thermoelectric pellets.

The present invention is directed generally to the direct production of electricity through thermoelectric effects and more particularly to a new and improved thermoelectric element which provides reliable operation over long time periods.

In accordance with the prior art, there have been provided tubular thermoelectric elements wherein the inner and outer surfaces of the tubular elements are subjected to different temperatures. Such temperature differences induce in the thermoelectric material the production of electrical currents in a well known manner. The provision of such tubular thermoelectric elements requires such element to retain good heat transfer and electrical contact characteristics under a variety of temperatures gradients encountered in operation which create substantial temperature drops between the inner and outer diameters of the structure. It has been determined that tubular thermoelectric elements having generally annular pellets of thermoelectric material positioned in a tandem array and surrounding a central conduit in good heat transfer relationship therewith tend to readjust under operating temperatures to disturb the electrical contact or the thermal contact (or both) between successive layers of the multilayer structure. It has been determined that after a relatively short operating period, the material readjustment under certain circumstances can interfere with the electrical contact or the heat transfer or both to such an extent as to render some thermoelectric elements substantially useless.

Accordingly, it is an object of this invention to provide a new and improved thermoelectric element of tubular configuration which has means for compensating for the material readjustments due to operating conditions and thereby results in a long lived element.

A further object of this invention is to provide a new and improved long life thermoelectric element which maintains the electrical contact between thermoelectric pellets throughout the entire lifetime of the element.

A still further object of this invention is to provide a new and improved long lived tubular thermoelectric element which assures good thermal contact between all adjacent contacting surfaces of the element over a wide temperature range.

Briefly the present invention accomplishes the above cited objects by providing a thermoelectric generator having a tubular metallic conduit closely received within an electrically insulating but thermally conductive layer. A tandem array of annuar thermoelectric pellets are disposed outwardly of the insulating layer in a manner to provide good heat transfer relationships between the pellets and the heat source within the central conduit. The outer surfaces of the thermoelectric pellets are closely surrounded with a layer of the electrically insulating material, which in turn is closely surrounded by a metallic sheath for confinement of the entire multilayered structure. The outer sheath is subjected to a relatively lower temperature through a coolant so that the temperature difference between the inner and outer surfaces of the thermoelectric pellets produces through thermoelectric effects an electrical current flowing through the pellets. means are provided to ensure good thermal contact between all adjacent surfaces of the thermoelectric pellets, the insulating layers, the tubular conduit and sheath and also to ensure good electrical contact at all times between adjacent thermoelectric pellets. Such means comprise in one embodiment of this invention an annular zone of liquid metal under pressure exerting inward forces on the outer protective sheath, the outer insulating layer and the thermoelectric pellets to both maintain the pellets in good heat transfer relationship with the insulating layer and to exert forces on the pellets tending to keep the adjacent pellets in good electrical contact with one another. Plastic (and in some instances, elastic) strain in the outer sheath of the element is induced by the forces which thereby absorb any thermally induced clearances. An outer sleeve maintains the liquid metal in its pressure exerting relationship with the thermoelectric pellets and a pressure backup means, normally a pressurized gas, serves to maintain a predetermined pressure on the liquid metal. The liquid metal being in good heat transfer relationship with the surfaces of its container and also being a good thermal conductor, does not adversely affect the heat transfer relationship between the thermoelectric pellets and the outer coolant.

In another embodiment of this invention, the pressurized liquid metal is positioned within the inner conduit through use of a double walled structure and the gas pressurizing means, thereby to exert an outwardly directed pressure on the inner surfaces of the tandemly arranged annular thermoelectric pellets. In this manner, even though the thermoelectric material, the insulating sleeves and the metallic conduits are subjected to different amounts of thermal expansion, the pressurizing means serves to produce plastic (or elastic) strain in the adjacent materials which absorb any thermally induced clearances between adjacent parts of the element.

Further objects and advantages of this invention and features of novelty which characterize the invention will be pointed out in particularity in the claims annexed to and forming a part of this specification.

For a better understanding of this invention, reference may be had to the accompanying drawings, in which.

Figures 1, 2, 3:
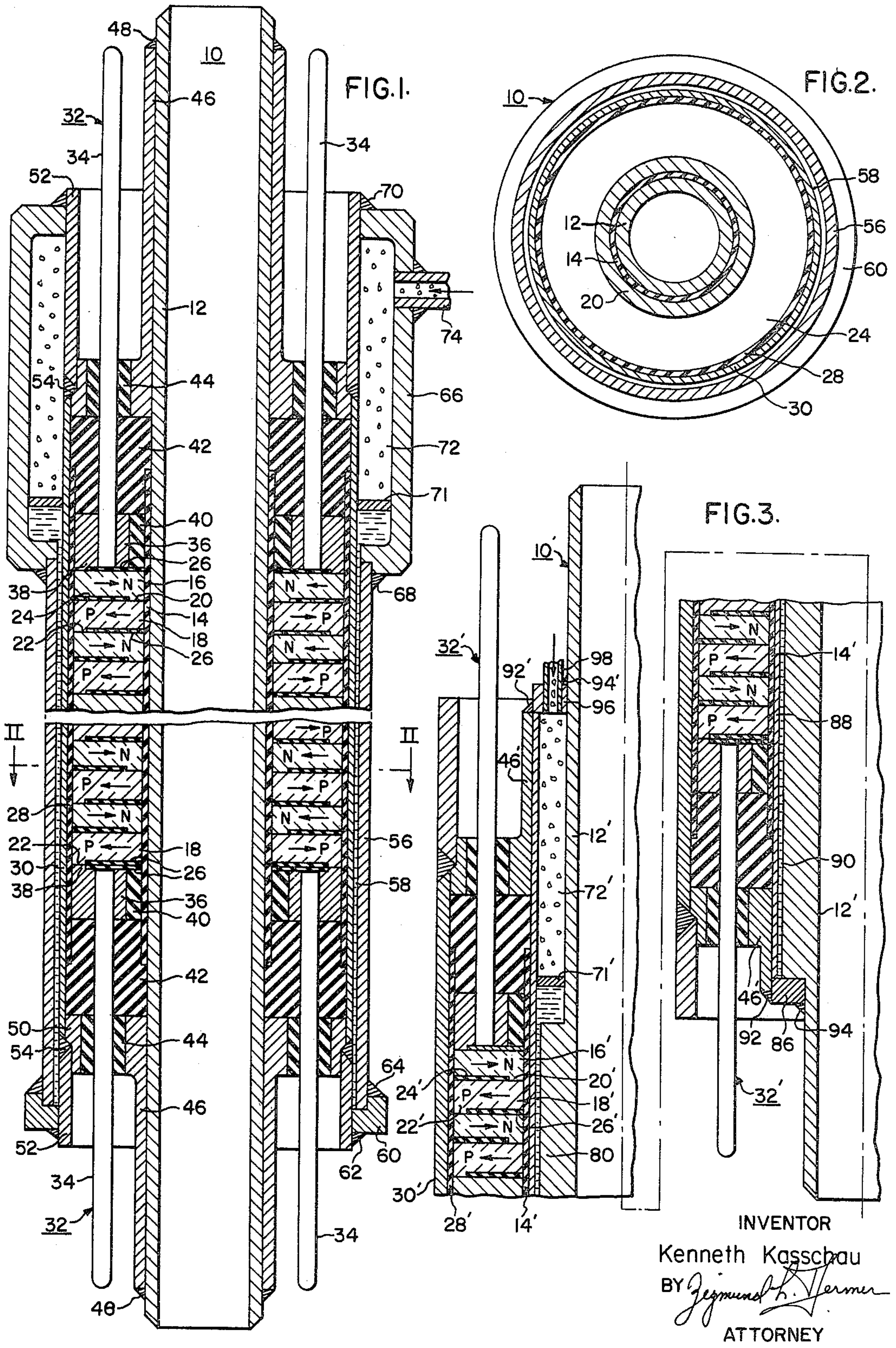
FIGURE 1 is a sectional view of a tubular thermoelectric generator constructed in accordance with the teachings of this invention.
FIG. 2 is a sectional view of the thermoelectric generator of FIG. 1 and taken substantially along the lines II—II thereof.
FIG. 3 is a longitudinal sectional view through a modified form of tubular thermoelectric generator incorporating the principles of this invention.

Referring now to the thermoelectric element illustrated in FIGS. 1 and 2, it will be appreciated that a thermoelectric generator 10 constructed in accordance with the principles of this invention includes a central tubular conduit 12, desirably formed from a heat conductive metal such as Inconel, which serves as a central support for the thermoelectric generator 10. The conduit 12 is adapted to be connected to a high temperature source, for example a fluid such as gas or liquid metal or an isotopic generator disposed within conduit 12. The heated fluid flows through the conduit 12 and heats conduit 12 to a temperature substantially equal to the temperature of the gas. A relatively thin sleeve of electrical insulating material 14 desirably formed from a material which exhibits relatively good heat transfer capabilities such as boron nitride surrounds the sleeve 12. Positioned around the insulating sleeve 14 are a plurality of thermoelectric pellets 16 which are of annular configuration and which closely receive the sleeve 14 in the central opening thereof. The pellets 16 desirably are mounted axially in tandem and are alternately formed from thermoelectrically negative and thermoelectrically positive material. A junction is formed on each pellet for providing electrical communication with the adjacent pellets in the tandem array. More particularly, for the thermoelectrically negative pellets, a generally annular shoulder 20 is formed adjacent the inner diameter thereof and for the thermoelectrically positive pellets 18 a similar annular shoulder 22 is positioned adjacent the outer diameter thereof. Each of the projections must provide contact between adjacent pellets for the conduction of electrical power. As a result the electrical contact must always be through a low resistance joint. Means for ensuring the low resistance joint will be described in detail hereinafter. A plurality of washers of insulating material 24 and 26 are provided. The washers 24 are the same thickness as the projections 20 and are positioned intermediate the projections 20 and the outer circumference of pellets 16 and 18. Positioned outwardly of thermoelectric pellets 16 and 18 and coextensively with sleeve 14 is a second insulating sleeve 28 also formed from a good heat conductive material such as boron nitride and closely receiving pellets 16 and 18 in the opening thereof. An outer tubular protective sheath 30 closely receives the sleeve 28 therein and is desirably formed from metallic material similar to sleeve 12. Sleeve 30, however, is formed to be substantially thinner than sleeve 12 for reasons to be described. Upper and lower terminal means 32 are provided for generator 10 with each terminal means 32 comprising a pair of spaced male conductors or prongs 34 with the upper prongs 34 being electrically connected to the upper thermoelectric pellet 16 and the lower prongs 34 being electrically connected to the lower thermoelectric pellet 18. To provide the electrical connection between prongs 34 and upper and lower pellets 16 and 18, each pair of prongs 34 is desirably mounted in an annular metallic member 36 formed from an electrically conducting material, for example an unalloyed iron such as Armco iron. The upper annular member 36 desirably is formed with an outer projection 38 thereon corresponding in shape to the projections 22 to provide electrical contact with adjacent thermoelectric washer 16. Disposed between projection 38 and the inner circumference of adjacent pellets 16 is another washer 26. A similar projection 38 is formed on the lower annulus 36 and is positioned to engage the projection 22 of lower thermoelectric pellet 18. A pair of insulating washers 26 are positioned intermediate last mentioned projections 38 and 22 and the inner circumference of lower pellet 18. A ceramic insulating sleeve 40 formed from a suitable insulating material such as a mixture of oxides of aluminum, silicon and magnesium desirably is positioned intermediate annular members 36 and insulating sleeve 14. Annular sleeve 42 is mounted in tandem adjacent annular members 36 and 40, desirably being formed from electrically insulating material. Sleeve 42 is provided with openings therein to permit passage of terminal posts 34 therethrough. Each terminal post 34 is surrounded by an insulating sleeve 44 so that a metallic retaining member 46 may be affixed between conduit 12 and sheath 30 for totally enclosing the above assemblage. In furtherance of this purpose, sleeve 46 desirably is secured to sleeve 12 by suitable means as by a circumferential weld at 48. An outer surface of sleeve 46 engages a relatively thickened end portion 52 of sheath 30 with end portion 52 being secured to sheath 30 by an annular weld 54. Disposed outwardly of sheath 30 and coextensive therewith is a relatively thicker pressure housing 56 of annular configuration which receives sheath 30 therein to provide an annular space 58 between pressure housing 56 and sheath 30. The lower end of the space 58 is closed off by a ring member 60 secured respectively to sheaths 30 and 56 by annular welds 62 and 64. A generally annular gas reservoir 66 is mounted adjacent the upper end of housing 30 and is secured to housing 56 by a circumferential weld 68 and is also secured to end member 52 by a circumferential weld 70. The gas reservoir housing 66 has a generally U-shaped cross section to form an annular opening 72 therein between housing 66 and sleeve 30 with the opening 72 communicating with annular space 58. An inlet conduit 74 desirably is connected to housing 66 for supplying pressurized fluid to the interior thereof.

In accordance with the invention, heat source such as a high temperature liquid metal is conducted through the conduit 12 for heating the interior of conduit 12 and the inward ends of thermoelectric pellets 16 and 18. On the other hand the outer surface of the generator 10 is desirably in communication with a relatively lower temperature coolant to expose the outer circumference of pellets 16 and 18 to the relatively lower temperature. During operation of the generator 10, different thermal expansions may occur in the conduit 12, insulating sleeve 14 and thermoelectric pellets 16 and 18 and insulating layer 28 and outer protective sheath 30. Materials readjustments resulting from the temperature changes have in the past caused an increased thermal and electrical resistance in generator 10. More particularly, the thermal resistance between sleeve 14 and conduit 12 and between sleeve 14 and pellets 16 and 18 was increased. Also, electrical contact between projections 20 and 22 and adjacent pellets 18 and 16, respectively increased in resistance. In order to overcome these forces and still provide for effective heat transfer relationships between thermoelectric generator 10 and fluids flowing through conduit 12 and adjacent outer housing 56, the space 58 and a portion of chamber 72 desirably is filled with a thermally conductive liquid metal, such as liquid sodium. The remainder of chamber 72 desirably is filled with a pressurized backup gas for example helium at a suitable high pressure, i.e. 1000 p.s.i., or greater. The high pressure of the gas in chamber 72 is introduced by inlet conduit 74 and results in the exertion of a pressure on the entire circumference of sheath 30. Alternatively, the pressure chamber 72 may be sealed at conduit 74 after it has been pressurized. In the event the generator 10 is used in a zero gravity environment, barrier means such as annular metallic piston 71 desirably is closely fitted between wall 66 and sheath 30 at the interface of the gas and the liquid metal in order to maintain the separation of the two fluids in a space environment.

Sleeve 30 is substantially thinner than housing 56 and is sized to cause operating stresses in sheath 30 above the elastic limit thereof. Plastic (or elastic) strain toward the center is induced on sheath 30 by the pressurized liquid metal causing sheath 30 to move inwardly until contact is made with inward parts of the generator 10 until a balancing pressure is developed. Since housing 12 desirably is substantially thicker than sheath 30, housing 12 is formed to resist yielding forces exerted thereon by the inwardly directed pressure induced forces. Thus, the total effect of the pressure is to provide the desired thermal contact between sleeve 14, housing 20 and pellets 16 and 18 and the desired electrical contact between adjacent pellets 16 and 18. Since a liquid metal is utilized to fill the annular space 58, there is not significant adverse effect on the heat transfer capabilities of generator 10 between the outer surface of thermoelectric pellets 16 and 18 and the low temperature coolant.

Referring now to the embodiment of this invention in FIGURE 3, it will be appreciated that many portions of the FIGURE 3 embodiment are duplicative of the FIGURE 1 arrangement. Accordingly, equivalent parts of the FIGURE 3 embodiment will be indicated by the same reference characters primed and will not be again described in detail.

Accordingly, the generator 10' of FIGURE 3 includes an inner conduit 12', an outer housing sleeve 30' and a pair of spaced insulating sleeves 14' and 28' which are coextensively and concentrically mounted and which receive therebetween a tandem array of annular themoelectric pellets 16' and 18'. The pellets 16' and 18' are respectively provided with projections 20' and 22' for electrical connection between adjacent pellets and are separated by insulating washers 24' and 26'. Each end of the thermoelectric pellet array is provided with a terminal structure 32' for transferring the electrical power produced in thermopile 10' to an external utilization means (not shown).

In the embodiment of the invention in FIGURE 3, the liquid metal pressurizing chamber 90 for maintaining electrical and thermal continuity in generator 10' is positioned between conduit 12' and a thin-walled tubular membrane 88 immediately within and in intimate contact with insulating sleeve 14'. Pressure introduced into this chamber will exert an outwardly directed force on the inner circumference of sleeve 14' and thermoelectric pellets 16' and 18'. To form the chamber 90, the conduit 12' is provided with an elongated outward projection designated by the reference character 80. A flange 86 of annular configuration is positioned in engagement with the lower end of projection 80 and is secured to terminal piece 46' and conduit 12' by annular welds 92 and 94 to seal the lower end of chamber 90.

The upper end of sleeve 12' and the tubular sleeve 88 combine to form a reservoir chamber 72' above projection 80. The upper end of chamber 72 is closed off by a ring member 96 secured to terminal piece 46' and sleeve 12' by welds 92' and 94'. The ring 96 has at least one flow port 98 formed therein for supplying material to the space 90 and chamber 72'. In accordance with the invention a suitable liquid metal such as sodium fills the chamber 90 and partially fills reservoir 72'. A gas backup means under high pressure fills the remainder of chamber 72' such that the liquid metal is always maintained under very high pressure. Means such as piston 71' are disposed at the interface of the liquid metal and gas in order to isolate the two fluids in a zero gravity environment. It will be appreciated that the thickness of the membrane 88 is substantially less than the thickness of the sleeve 12'. The pressurized liquid metal in chamber 90 induces radially outward pressures on membrane 88 and creates stresses above the elastic limit in membrane 88 thus permitting plastic strain thereof. Under these conditions, the thin-walled membrane 88 will flow outwardly until contact is made with the thermoelectric structure and insulating sleeves 14' and 28' until a balancing pressure is developed. It is this pressure that is effective in maintaining good thermal contact, and by preventing uncontrolled redistribution of the thermoelectric material, maintains the required electrical contact between pellets.

It will be appreciated that the gas bubble in reservoirs 72 and 72' is prevented from entering clearance regions 58 and 90. Accordingly, the heat transfer between the adjacent coolant and the adjacent circumference of the thermoelectric materials is not adversely affected by the presence of the gas bubble since the flow path between the thermoelectric material and the coolant or heat transfer medium comprises only metallic members, save for the high heat transfer electrical insulating layers of boron nitride (layers 14 and 28 of FIG. 1 and layers 14' and 28' of FIG. 3). With the plastic strain caused by the pressurized liquid metal system, there is always provided an induced force which tends to maintain good thermal and electrical contact within the thermopile 10 and 10' at all operating conditions, thereby permitting a long lifetime thermoelectric generator.

It will be appreciated that many modifications may be made in the embodiments of the invention described in detail herein without departing from the broad spirit and scope of this invention. Accordingly, it is specifically intended that the detailed embodiments be interpreted as illustrative of the invention, rather than limitative thereof.

I claim as my invention:

1. In a thermoelectric device, a pair of concentric tubular supporting members, a tandem array of annular thermoelectric pellets positioned between and engaging said supporting members, adjacent ones of said thermoelectric pellets being disposed in electrical contact with one another, means for maintaining said electrical contact between said pellets and for providing thermal contact between said pellets and said supporting members, said means inducing a plastic strain on at least one of said supporting members to move the latter and said pellets into respective engagement.

2. In a thermoelectric device, a pair of concentric tubular supporting members, a tandem array of annular thermoelectric pellets positioned between and engaging said supporting members, adjacent ones of said thermoelectric pellets being disposed in electrical contact with one another, means fair maintaining said electrical contact between said pellets and for providing thermal contact between said pellets and said supporting members, said contact maintaining means inducing a plastic strain on at least one of said supporting members, a pressurizing chamber disposed adjacent one of said supporting members, said chamber being filled with liquid metal under pressure, said liquid metal inducing forces on said one supporting member to move said supporting members and said pellets into respective engagement for maintaining electrical contact between said adjacent thermoelectric pellets and for maintaining thermal contact between said pellets and both of said supporting members.

3. In a thermoelectric device, an inner tubular supporting member, an annular sleeve of electrical insulating material closely receiving at least a portion of said supporting member in the opening thereof, a tandem array of annular thermoelectric pellets receiving said sleeve and said inner supporting member in the openings thereof and positioned in juxtaposed relationship with said sleeve, a second tubular sleeve of insulating material positioned outwardly of said pellets and receiving said pellets in the opening thereof, an outer tubular supporting member disposed outwardly of said second insulating sleeve, said outer supporting member having a radial thickness substantially smaller than the corresponding thickness of said inner supporting member, and pressurizing means positioned adjacent said outer supporting member inducing a plastic strain on said second supporting member to move said supporting members, said sleeves and said pellets into respective engagement.

4. In a thermoelectric device, an inner tubular supporting member, an annular sleeve of electrical insulating material closely receiving at least a portion of said supporting member in the opening thereof, a tandem array of annular thermoelectric pellets receiving said sleeve and said inner supporting member in the openings thereof and positioned in juxtaposed relationship with said sleeve, a second tubular sleeve of insulating material positioned outwardly of said pellets and receiving said pellets in the opening thereof, an outer tubular supporting member disposed outwardly of said second insulating sleeve, said outer supporting member having a radial thickness substantially smaller than the corresponding thickness of said inner supporting member, and pressurizing means positioned adjacent said outer supporting member inducing a plastic strain on said outer supporting member, said pressurizing means comprising a chamber disposed outwardly of said outer supporting means, said chamber being filled with a pressurized thermally conductive medium.

5. In a thermoelectric device, a tubular outer supporting member, a liner of insulating material engaging at least a portion of the inner surface of said outer supporting member, a tandem array of annular thermoelectric pellets disposed within said outer supporting member and positioned in juxtaposed relationship with and engaging said liner, a tubular liner of insulating material engaging the surface of said pellets formed by the openings therein, a tubular inner supporting member received within and engaging said tubular liner, and pressurizing means positioned adjacent said inner supporting member and inducing radial forces in said inner supporting member to move said supporting members, said liners and said pellets into respective engagement, said inner supporting member having a radial thickness substantially smaller than the corresponding dimension of said outer supporting member, whereby said pressurizing means induces a plastic strain on said inner supporting member.

6. In a thermoelectric device, a tubular outer supporting member, a tubular liner of insulating material engaging at least a portion of the inner surface of said outer supporting member, a tandem array of annular thermoelectric pellets disposed within said outer supporting member and positioned in juxtaposed relationship with said liner, a second tubular liner of insulating material engaging the surface of said pellets formed by the opening therein, a tubular inner supporting member received within and engaging said second liner, and pressurizing means positioned adjacent said inner supporting member and inducing radial forces in said inner supporting member, said inner supporting member having a radial thickness substantially smaller than the corresponding dimension of said outer supporting member, whereby said pressurizing means induces a plastic strain on said inner supporting member, said pressurizing means comprising a pressurizing chamber positioned adjacent the inner wall of said inner supporting member, said chamber being filled with a thermally conductive fluid under pressure.

7. In a thermoelectric device, a pair of concentric tubular supporting members, a tandem array of annular thermoelectric pellets positioned between said supporting members, adjacent ones of said thermoelectric pellets being disposed in electrical contact with one another, means for maintaining said electrical contact between said pellets and for providing thermal contact between said pellets and said retaining members, said means inducing a plastic strain on at least one of said supporting members, a pressurizing chamber disposed adjacent one of said supporting members, said chamber being filled with liquid metal, back up means for pressurizing said liquid metal comprising a fluid under pressure, means for isolating said liquid metal from said fluid comprising a barrier disposed in said chamber at the interface of said liquid metal and said fluid, said liquid metal inducing forces on said one supporting member for maintaining electrical contact between said adjacent thermoelectric pellets and for maintaining thermal contact between said pellets and both of said supporting members.

References Cited

UNITED STATES PATENTS

| | | | |
|---|---|---|---|
| 3,304,205 | 2/1967 | Lord et al. | 136—208 |
| 775,188 | 11/1904 | Lyons et al. | 136—208 |
| 2,543,331 | 2/1951 | Okolicsanyi | 136—210 |
| 2,652,503 | 9/1953 | Pack | 136—212 |
| 2,811,568 | 10/1957 | Lloyd | 136—208 X |
| 3,004,393 | 10/1961 | Alsing | 136—208 X |
| 3,054,840 | 9/1962 | Alsing | 136—210 X |
| 3,211,586 | 10/1965 | McCoy et al. | 136—202 |
| 3,277,827 | 10/1966 | Roes | 136—205 X |
| 3,291,647 | 12/1966 | Schneider et al. | 136—204 |

ALLEN B. CURTIS, Primary Examiner